United States Patent [19]

Marmolejo et al.

[11] Patent Number: 5,429,047
[45] Date of Patent: Jul. 4, 1995

[54] METHOD OF PRINTING COLOR IMAGES ON TEXTURED SURFACES

[76] Inventors: Paula J. Marmolejo; Alexander Marmolejo, both of 220 E. Flamingo Rd., No. 330, Las Vegas, Nev. 89109

[21] Appl. No.: 334,931

[22] Filed: Nov. 7, 1994

[51] Int. Cl.$^6$ .................. B41F 15/10; B41M 1/18; B41M 1/26
[52] U.S. Cl. .................................................. 101/211
[58] Field of Search .............. 101/211, 115, 129, 490, 101/491, 483, 181, 183, 171; 118/110, 112; 427/210, 256, 258, 261, 268, 272, 282, 288, 402, 510; 430/300, 269, 301

[56] References Cited

U.S. PATENT DOCUMENTS

| | | | |
|---|---|---|---|
| 3,581,660 | 6/1971 | Rapoport | 101/450.1 |
| 4,011,085 | 3/1977 | Rapoport | 359/893 |
| 4,037,533 | 7/1977 | Rapoport et al. | 101/211 |
| 4,816,295 | 3/1989 | Cardinale | 427/510 |
| 5,168,811 | 12/1992 | Cox | 101/424.1 |

*Primary Examiner*—J. Reed Fisher
*Attorney, Agent, or Firm*—John R. Duncan; Frank D. Gilliam

[57] ABSTRACT

A process for producing high quality multi-color images on textured surfaces. A plurality of color separation negatives are produced from an original multi-color image. Printing plates are prepared using the color separation negatives and a stochastic random dot screen. The plates are mounted on a series of printing units and the separation images are printed in register using an ink that is cured to a substantially dry state by exposure to ultraviolet radiation. A source of ultraviolet radiation is placed between each pair of printing units to cure each image before the next is printed. The images are printed on a textured substrate, such as canvas. Selected areas are then overprinted serigraphically using transparent to translucent liquids, at least some of which include translucent colorants. The imaged substrate may be coated with a liquid plastic which is textured as the plastic dries. The final product is a high quality, artistic, rendering of the original image.

12 Claims, 1 Drawing Sheet

METHOD OF PRINTING COLOR IMAGES ON TEXTURED SURFACES

BACKGROUND OF THE INVENTION

This invention relates in general to methods of printing images in color on sheet surfaces and, more particularly, to a method of printing very high quality color images on textured surfaces, such as canvas.

A very great number of methods have been developed for rapidly printing a large number of multi-color images on sheet material, generally paper or the like. In the most common color printing method, an original multi-color image is photographed through halftone screens with color filters to reproduce each of the three subtractive primary colors, cyan, yellow and magenta, plus black. Conventional halftone screens have a regular grid pattern formed by intersecting opaque lines on a clear substrate, such as glass or plastic, leaving an array of clear dots. The screens break the photographic image into evenly spaced dots that are larger in size in the dark areas of the image and smaller in light areas. The greater the number of dots per inch, the greater the image's sharpness and detail. There is a limit to how fine the screens can be made without printing problems. Also, if the screens are not correctly oriented, typically at 70° to each other, Moiré patterns may result, producing a distracting wavy pattern across the image. While halftone printing with modern materials gives excellent color rendition when properly done, these problems limit ultimate quality obtainable.

Recently, a method of printing has been developed that uses random dots instead of the regular dot pattern of conventional halftone. This method is described, for example, by Rapoport et al. in U.S. Pat. No. 4,037,533. Through computer techniques, the distribution of very small dots is carefully randomized and the dots are placed more or less often as required to reproduce the image, in no determinable pattern. In light colored areas, single spaced dots will appear, while in heavily colored areas the dots form in randomly-shaped clumps. This method is generally called "stochastic" or "FM" screening. This substantially eliminates Moiré patterns and "rosette" color clumps while simplifying printing with more than four colors. However, there are several problems with using stochastic screening with most conventional overall printing processes. Many of these processes are not sensitive enough to capture all of the available detail, especially in proofing.

Since the earliest days of lithography, printing plates have been fastened around a cylinder and dampened with a fountain solution, a mildly acidic or neutral liquid that usually consists of water and chemical additives. The water repels the inks, which are water-resistant, from the non-image areas of the printing plate so that when the plate is inked, the ink adheres only to the areas that contain an image. The plate is then pressed against a rubber blanket to which the image is transferred. The image is then retransferred onto paper or other surfaces to transfer the ink image. With fine dot pattern plates, the milling effect of the press rollers can cause the ink to become emulsified to the point where the fine pattern is not reproduced. Special silicone coated plates have been developed that do not require a fountain solution. A typical waterless printing process is described by Abiko et al. in U.S. Pat. No. 4,259,905. Much more detailed dot patterns can be printed. However, there are problems in printing by this waterless technique. Precise temperature control of the ink is required, which may vary with inks of different colors. The printing plates may undergo excessive wear.

With either the water based or waterless printing system, the ink applied in the first step of multi-color printing will still be wet when the next color is applied. This can result in latent image transfer, which occurs when a wet ink laid down by one print unit is transferred to the next unit and subsequently laid down again along with the color image being printed by the current unit. This produces poor quality, blurred, final prints. In some cases an anti-offset powder is applied to the print medium between printing steps. While helpful in drying the ink, the powder tends to produce a rough surface on the printing medium, such as paper, when it becomes embedded in the material. Also, the ink must be allowed to fully dry before the second side of the material can be printed. Ideally, the ink would be dried after one color is applied to the printing medium before the next color can be applied. However, this slows the printing process excessively.

Inks that can be dried by exposure to ultraviolet light (UV) or electron beams between printing steps have been developed. Printing using these inks is generally referred to as "dry trap" printing. Typically, ultraviolet driers are positioned between succeeding print units. Because the inks are dried immediately, they are not absorbed into the paper, giving higher density images for a given quantity of ink and lower grades of paper may be used without excessive bleeding.

While dry trap printing gives excellent image quality at high speed, the inks are relatively expensive and the series of UV driers must be provided. The inks dry dull, without any gloss, so that overcoating with a gloss coating is necessary for glossy images.

While each of the stochastic, waterless and dry trap processes, when carefully used, will produce excellent printing detail, they generally require high quality, smooth, paper surfaces for optimum print quality. A smooth surface texture results.

For high quality art prints it is often desirable to print on canvas or other textured surfaces. Further, enhancing an art image with variable surface texture effects, translucent overcoated colors, etc. often is desirable to enhance artistic effects.

Thus, there is a continuing need for improved printing processes to provide very high quality, highly detailed images on canvas or textured surfaces.

SUMMARY OF THE INVENTION

The above noted problems, and others, are overcome in accordance with this invention by a process for producing high quality color images on textured surfaces which basically comprises providing a multi-color transparency, typically photographed from an original art work, producing a plurality of color separation negatives, typically cyan, magenta, yellow and black, providing at least one stochastic random dot screen having a selected dot pattern and dot size range, preparing printing plates from said transparencies and screen, printing a substrate, typically for the purposes of this invention a textured material, such as canvas, from each plate in seriatim, using an ink that rapidly drys or cures when exposed to UV radiation, exposing the substrate to UV radiation after each printing step for a period sufficient to substantially dry the ink and post-printing treating the completed imaged substrate.

The post-printing treatment is selected from the group consisting of serigraphically printing translucent colors on predetermined areas of the printed image; serigraphically coating selected areas of the printed image with a varnish having selected gloss levels; coating the printed image with an acrylic coating and texturing that coating; and any suitable combination thereof.

BRIEF DESCRIPTION OF THE DRAWING

Details of the invention, and of preferred embodiments thereof, will be further understood upon reference to the drawing, wherein the FIGURE is a flow diagram illustrating the steps of the process of this invention and alternative final steps.

Initially, as indicated in block 10, an original multi-color work to be reproduced is selected. Because of the textured appearance that the prints produced by the process of this invention, generally a high-quality art work will be selected, although any multi-color original, including text, photographs, posters and the like may be used. Various qualities of the original can be reproduced or enhanced, such as by varying the degree of surface gloss, providing areas of varying gloss and providing selected areas of translucent colors over opaque color.

Figure 1:
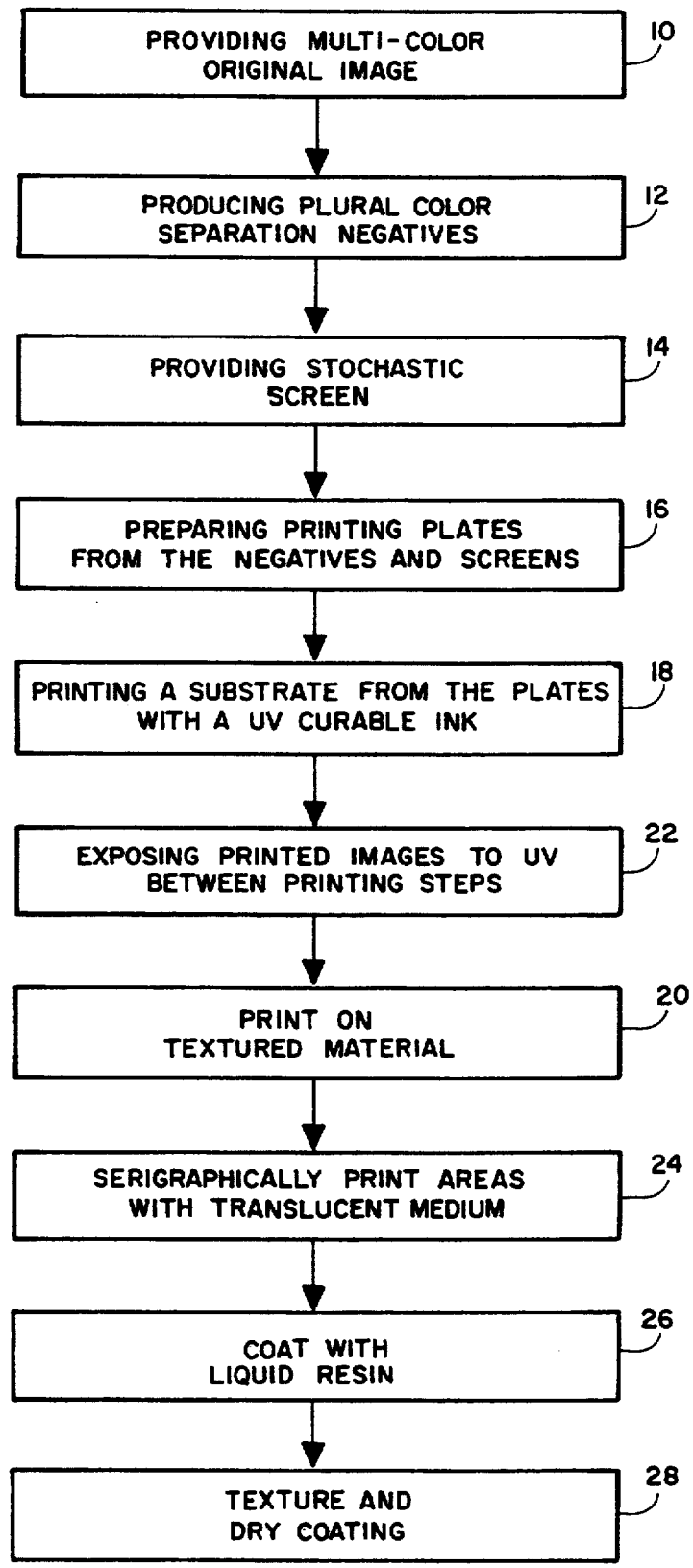

Conventional color separation negatives are then prepared as indicated in block 12. While any number of negatives using any different color filters may be used, typically four negatives are produced, using conventional filters to produce negatives for cyan, magenta, yellow and black. The negatives may be prepared by conventional photographic techniques or by electronic scanning methods using scanners such as the Smartscanner available from Scitex America Corporation.

Next, as indicated in block 14 a random dot or "stochastic" screen is prepared in a conventional manner, having any selected dot pattern and size range. Very fine dot patterns and small dot sizes can be accommodated by the process of this invention, resulting in exceptional image detail. Typical methods of preparing these screens are described by Rapoport in U.S. Pat. Nos. 3,581,660 and 4,011,085.

Printing plates are prepared in a conventional manner from the color separations and stochastic screen, as indicated in block 16. Any suitable printing press and process may be used. Typically, the plates are secured to a series of cylinders, with the substrate to be printed fed though the sequence of printing units. As indicated in block 18, the inks used are selected from known inks which can be dried by exposure to suitable radiation such as ultraviolet or electron beam radiation. For ease of application and effectiveness, UV radiation is preferred.

The images are printed on a textured substrate (block 20). Typical textured substrate materials include canvas, paper having a textured surface, textured plastic and the like. Of these, canvas is preferred to produce a final product having the appearance of original art painted on canvas. The printed canvas can be stretched and mounted in the same manner as original art on canvas.

Whichever substrate material is selected, the substrate after passing through each printing unit is exposed to UV radiation for a sufficient period at a sufficient intensity, as is well known in the printing art, to substantially dry the ink before the substrate passes on to the next printing unit as indicated in block 22.

Where the image was printed on textured material, such as canvas the printed substrate may, as is preferred, pass to a seriograph station, block 24, where selected areas are overcoated with transparent to translucent material by serigraphic (aka silk screen) techniques. For example, selected areas may be highlighted with transparent areas of different gloss, from dull through low gloss to high gloss. Alternately, or in addition, areas may be overcoated with translucent materials containing various transparent or translucent colorants which allow the underlying opaque areas to show through, to produce highly attractive artistic affects. Many variations may be accomplished with the combination of opaque printing and a few translucent overlays of different colors in different areas which would take a great number of serigraphic steps if the image were produced entirely serigraphically.

Next, as indicated in block 26, the entire image can be coated with a clear resin, preferably an acrylic resin which is then textured (block 28) as it dries or cures. Any suitable acrylic resin in any suitable solvent that does not attack the image materials, producing any selected degree of gloss, may be used. Typical of these acrylic overcoating and texturing processes is the Acrylograph process of the August Art Company, Huntington Beach, Calif. The texturing can be accomplished in any suitable manner, such as rolling with a roller having an irregular or textured surface, such as a conventional paint roller, a sponge, etc. A very attractive light diffusing surface having widely variable characteristics can be produced in this manner.

While certain specific relationships, materials and other parameters have been detailed in the above description of preferred embodiments, those can be varied, where suitable, with similar results. Other applications, variations and ramifications of the present invention will occur to those skilled in the art upon reading the present disclosure. Those are intended to be included within the scope of this invention as defined in the appended claims.

We claim:

1. A process for producing high quality color images on textured surfaces which comprises the steps of:
   providing a multi-color original image;
   producing a plurality of different color separation negatives from said original image;
   providing a stochastic random dot screen;
   preparing printing plates from said screen and negatives;
   mounting said printing plates on a series of printing units;
   providing a textured substrate to be printed;
   printing from each of said color separation negatives in seriatim, using inks that cure to a substantially dry state in response to high energy radiation, to produce a multi-color final image;
   exposing printed images between printing units to sufficient high energy radiation to cure applied ink to a substantially dry state; and
   serigraphically printing predetermined areas of said final image with selected transparent to translucent coatings, at least some of which may contain translucent colorants;
   whereby high quality multi-color images of high artistic content result.

2. The process according to claim 1 wherein said substrate is canvas.

3. The process according to claim 1 including the further steps of coating said final image with a liquid resin and texturing said coating as said coating hardens.

4. The process according to claim 3 wherein said liquid resin is an acrylic resin in a volatile solvent and said texturing is accomplished by rolling said coating with a roller having a predetermined surface texture as said solvent evaporates.

5. The process according to claim 1 wherein said high energy radiation is selected from the group consisting of ultraviolet, electron beam and infrared radiation and combinations thereof.

6. A process for producing high quality color images on textured surfaces which comprises the steps of:
   providing a multi-color original image;
   producing a plurality of different color separation negatives from said original image;
   providing a stochastic random dot screen having predetermined dot size and spacing;
   preparing printing plates from said screen and negatives;
   mounting said printing plates on a secession of printing units;
   providing a substrate having a textured surface to be printed;
   printing from each of said color separation negatives in seriatim, using inks that cure to a substantially dry state in response to ultraviolet radiation, to produce a multi-color final image;
   exposing printed images between printing units to sufficient ultraviolet radiation to cure applied ink to a substantially dry state; and
   serigraphically printing predetermined areas of said final image with selected transparent to translucent coatings, at least some of which may contain a translucent colorant;
   coating said final image with a liquid resin; and
   texturing said coating as said coating hardens;
   whereby high quality multi-color images of high artistic content having a textured surface result.

7. The process according to claim 6 wherein said substrate is canvas.

8. The process according to claim 6 wherein said liquid resin is an acrylic resin in a volatile solvent and said texturing is accomplished by rolling said coating with a roller having a predetermined surface texture as said solvent evaporates.

9. The process according to claim 6 wherein said high energy radiation is selected from the group consisting of ultraviolet, electron beam and infrared radiation and combinations thereof.

10. A process for producing high quality color images on textured surfaces which comprises the steps of:
    providing a multi-color original image;
    producing a plurality of different color separation negatives from said original image;
    providing a stochastic random dot screen;
    preparing printing plates from said screen and negatives;
    mounting said printing plates on a series of printing units;
    providing a canvas substrate to be printed;
    printing from each of said color separation negatives in seriatim, using inks that cure to a substantially dry state in response to high energy radiation, to produce a multi-color final image;
    exposing printed images between printing units to sufficient high energy radiation to cure applied ink to a substantially dry state; and
    serigraphically printing predetermined areas of said final image with selected transparent to translucent coatings, at least some of which contain translucent colorants;
    whereby high quality multi-color images of high artistic content result.

11. The process according to claim 10 including the further steps of coating said final image with a liquid resin and texturing said coating as said coating hardens.

12. The process according to claim 11 wherein said liquid resin is an acrylic resin in a volatile solvent and said texturing is accomplished by rolling said coating with a roller having a predetermined surface texture as said solvent evaporates.

* * * * *